United States Patent [19]

Okuda

[11] Patent Number: 4,927,471

[45] Date of Patent: May 22, 1990

[54] SEMICONDUCTOR SUBSTRATE COMPRISING WAFER SUBSTRATE AND COMPOUND SEMICONDUCTOR LAYER

[75] Inventor: Hiroshi Okuda, Atsugi, Japan

[73] Assignee: Fujitsu Limited, Kanagawa, Japan

[21] Appl. No.: 316,633

[22] Filed: Feb. 28, 1989

[30] Foreign Application Priority Data

Mar. 1, 1988 [JP] Japan .................. 63-45820

[51] Int. Cl.$^5$ .......................... H01L 21/20
[52] U.S. Cl. .................. 148/33.5; 437/110; 437/132; 437/107; 357/16; 148/DIG. 60
[58] Field of Search .............. 148/33.5, DIG. 160; 437/110, 126, 128, 131, 132, 133, 81, 105, 106, 107; 357/16

[56] References Cited

U.S. PATENT DOCUMENTS

| 4,088,515 | 5/1978 | Blakeslee | 437/110 |
| 4,769,341 | 9/1988 | Luryi | 437/132 |
| 4,771,013 | 9/1988 | Curran | 437/110 |
| 4,793,872 | 12/1988 | Mennier | 437/110 |
| 4,804,639 | 2/1989 | Yablonovitch | 148/33.5 |

FOREIGN PATENT DOCUMENTS 0248121 10/1988 Japan .................. 437/110

OTHER PUBLICATIONS

N. El-Masry et al., "Defect Reduction in GaAs Epilayers on Si . . . ", Mat. Res. Suc. Symp. Proc., vol. 91, 1897, pp. 99–103.

Two C. Chong and Clifton G. Fonstad, "Low-Threshold Operation of . . . ", Appl. Phys. Lett. 51(4), Jul. 1987, pp. 221–223.

Nakayama, "Effects of . . . ", Appl. Phys. Lett. 48 (4), 1/27/86, pp. 281–283.

Primary Examiner—Brian E. Hearn
Assistant Examiner—Kevin McAndrews
Attorney, Agent, or Firm—Armstrong, Nikaido, Marmelstein, Kubovcik & Murray

[57] ABSTRACT

A semiconductor substrate including a top epitaxial compound layer comprising: a single-crystalline semiconductor wafer substrate; a strained layer superlattice (SLS) structure layer having a lattice constant varying from that of the wafer substrate to that of the top compound semiconductor layer and formed on the wafer substrate; a semiconductor buffer layer having the same lattice constant as that of the top compound semiconductor layer and formed on the SLS structure layer; another SLS structure layer for filtering dislocations having a fixed lattice constant equal to that of the top semiconductor layer and formed on the buffer layer; and the top semiconductor layer formed on the another SLS structure layer.

9 Claims, 4 Drawing Sheets

LATTICE CONSTANT

COMPOSITION

SEMICONDUCTOR SUBSTRATE COMPRISING WAFER SUBSTRATE AND COMPOUND SEMICONDUCTOR LAYER

BACKGROUND OF THE INVENTION

1. Field of the Invention

The present invention relates to a semiconductor substrate for a production of semiconductor transistor devices or photonic devices, and more particularly, to a compound semiconductor substrate comprising a single-crystalline semiconductor wafer substrate, a compound semiconductor epitaxial layer, and a strained layer superlattice (SLS) structure layer between the wafer layer and the epitaxial layer.

2. Description of the Related Art

Generally, a single-cyrstalline wafer of a binary compound semiconductor, such as GaAs and InP is used as a substrate for epitaxial growth of a compound semiconductor layer thereon.

For the epitaxial growth of a good quality compound semiconductor layer on the wafer substrate, it is necessary to coincide the lattice constant of the compound semiconductor epitaxial layer with that of the wafer substrate, which considerably limits the composition range of the epitaxial layer.

Recently, it has become necessary to form (grow) a compound semiconductor layer having a different lattice constant from that of the wafer substrate for semiconductor lasers having a relatively short emission wavelength. On the other hand, proposals have been made for producing GaAs grown on Si (GaAs/Si) substrates corresponding to a single-crystalline GaAs substrate, enlarging the wafer size, increasing the mechanical strength and thermal conductivity, and reducing costs, compared with the single-crystalline GaAs substrate. The GaAs has a lattice constance larger than that of Si, by about 4%.

Where such a compound semiconductor layer including the GaAs layer is grown, an SLS structure layer is integrated as a buffer between the substrate and the grown layer, for the following reasons:

(1) The SLS buffer layer reduces dislocations in the grown compound semiconductor layer by preventing an extension of threading dislocations from the substrate into the compound semiconductor layer, due to the strain field in the SLS; and (2) The SLS buffer layer allows the epitaxial growth of the compound semiconductor layer having a different lattice constant from that of the substrate by absorbing a lattice mismatch without generating threading dislocations, due to an alternate expansion and contraction of strained very thin layers of SLS.

However, SLS buffer layers having both the satisfactory effects of (1) filtering of dislocations and (2) compensation of a lattice mismatch, have not yet been developed.

FIGS. 1A, 1B and 1C are fragmented sectional views of trial compound semiconductor substrate comprising at least a single-crystalline compound semiconductor wafer substrate, an SLS buffer layer, and an epitaxial compound semiconductor layer.

In these drawings, 1 indicates a GaAs (single-crystalline) wafer substrate having a lattice constant $a_s$, 2 indicates an $In_xGa_{1-x}P$ graded layer, the component ratio "x" of which decreases from the wafer substrate side upward, 3 indicates an SLS structure layer of $In_{0.24}Ga_{0.76}P$-$In_{0.76}Ga_{0.24}P$, and 4 indicates an epitaxially grown $In_{0.3}Ga_{0.7}P$ layer having a lattice constant $a_e$. Reference 5 indicates an SLS structure layer having a lattice constant $a_1$ approximate to that $(a_s)$ of the wafer substrate 1, 6 indicates an SLS structure layer having a lattice constant $a_2$ approximate to that $(a_e)$ of the $In_{0.3}Ga_{0.7}P$ layer 4, and 7 indicates generated threading dislocations. Reference 8 indicates an SLS structure layer having the same lattice constant as that of the GaAs wafer substrate, and 9 indicates an epitaxially grown In Ga P layer having the same lattice constant.

In the first compound semiconductor substrate shown in FIG. 1A, the lattice constance $a_s$ of the wafer substrate 1 is not equal to the lattice constant $a_e$ of the $In_{0.3}Ga_{0.7}P$ layer 4 and the $In_xGa_{1-x}P$ graded layer 2 compensates this lattice mismatch. The wafer substrate 1 has a dislocation density on the order of $\sim 10^4$ cm$^{-2}$, and the graded layer 2 has a dislocation density on the order of $\sim 10^8$ cm$^{-2}$, since dislocation are newly generated in the graded layer 2. The SLS structure layer 3 reduces the dislocations, but the dislocation density is still on the order of $\sim 10^6$ cm$^{-2}$. Since dislocation in the epitaxial grown $In_{0.3}Ga_{0.7}P$ layer 4 follow the dislocations in the SLS structure layer 3, the layer 4 has a dislocation density on the order of $\sim 10^6$ cm$^{-2}$. Furthermore, the compound semiconductor substrate is warped to some extent.

In the second compound semiconductor substrate shown in FIG. 1B, the lattice constants have the relationship "$a_e > a_2 > a_1 > a_s$ or $a_e < a_2 < a_1 < a_s$", and dislocations are unavoidably newly generated in the lower SLS structure layer 5. Although the upper SLS structure layer 6 reduces a dislocation density, the $In_{0.3}Ga_{0.7}P$ layer 4 has a dislocation density about 2 orders higher in magnitude than that of the wafer substrate 1. In this case, warping of the second compound semiconductor substrate is remarkably reduced.

In the third compound semiconductor substrate shown in FIG. 1C, since the SLS structure layer 8 substantially reduces dislocations, the epitaxially grown In Ga P layer 9 has a remarkably reduced dislocation density. Nevertheless, the lattice constants of the wafer substrate 1, and the layers 8 and 9 are the same, and thus the SLS structure layer 8 has the filtering effect but no compensation effect.

As mentioned above, interposition of an SLS structure layer or combined SLS structure layers between the wafer substrate and the epitaxial compound semiconductor layer cannot simultaneously attain the two above effects.

SUMMARY OF THE INVENTION

An object of the present invention is to provide a compound semiconductor substrate including an epitaxially grown compound semiconductor layer having a different lattice constant from that of a single-crystalline wafer substrate, and a low dislocation density.

Another object of the present invention is to improve a buffer between the wafer substrate and the epitaxial compound semiconductor layer.

These and other objects of the present invention are attained by providing a semiconductor substrate including a top epitaxial compound semiconductor layer comprising: a single-crystalline semiconductor wafer substrate; a strained layer superlattice (SLS) structure layer having a lattice constant varying from that of the wafer substrate to that of the top compound semiconductor layer, and formed on said wafer substrate; a compound semiconductor buffer layer having the same lattice constant as that of the top compound semiconductor layer, and formed on the SLS structure layer; another SLS structure layer for filtering dislocations having a fixed lattice constant equal to that of the top compound semiconductor layer, and formed on the buffer layer; and the top semiconductor layer formed on the another SLS structure layer.

The wafer substrate is composed of a compound semiconductor (e.g., GaAs, InP) or of silicon (Si).

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Figure 1A:
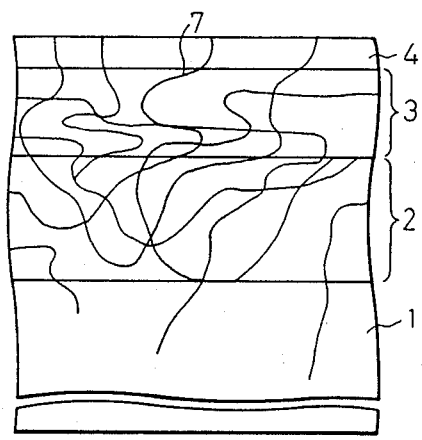
FIGS. 1A to 1C are fragmented sectional views of trial semiconductor substrates.
Figure 1B:
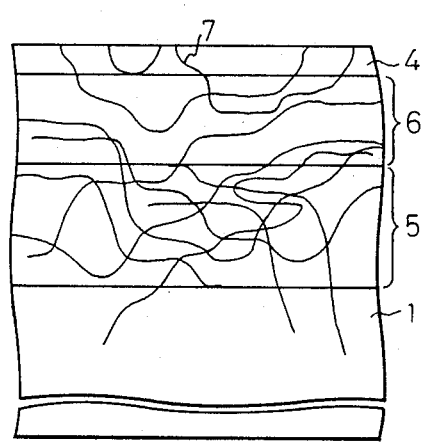
Figure 1C:
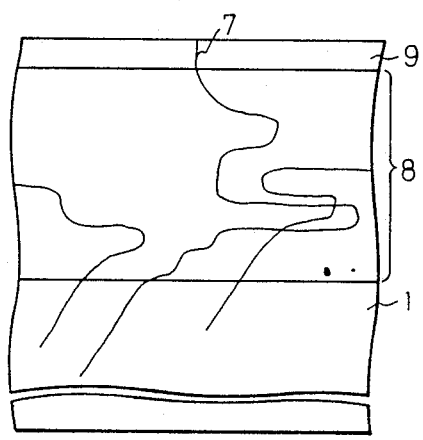
Figure 2C:
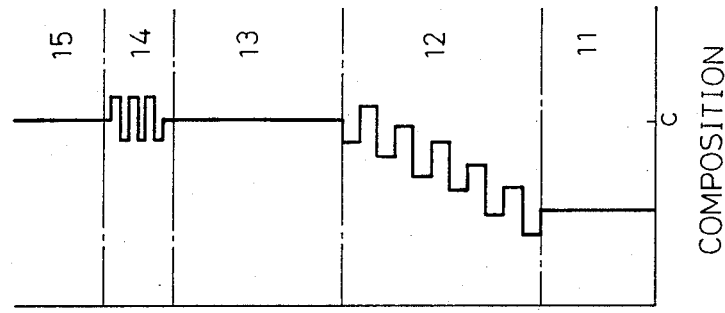
FIG. 2C is a graph of composition variation of the substrate of FIG. 2A.
Figure 2B:
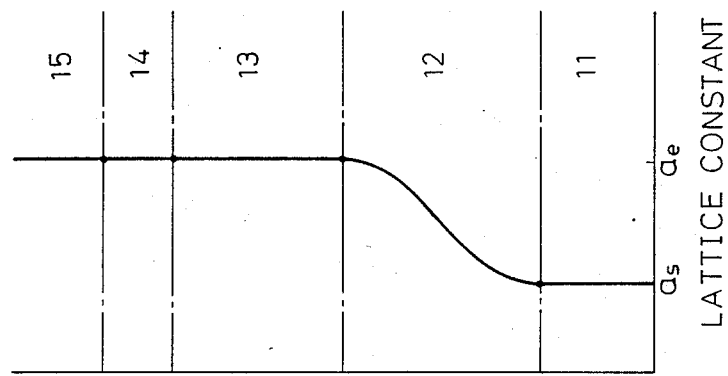
FIG. 2B is a graph of lattice constant variation of the substrate of FIG. 2A.
Figure 2A:
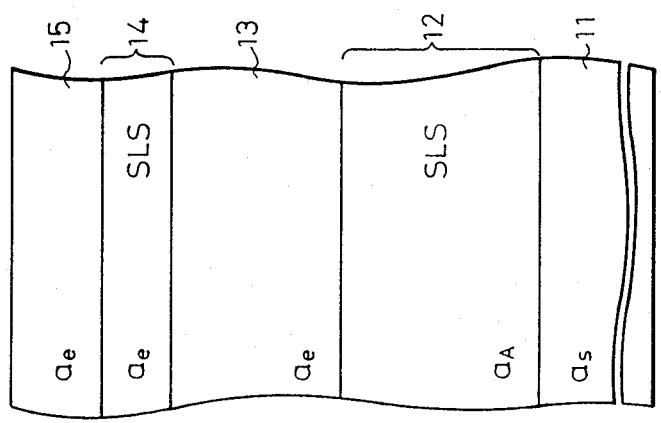
FIG. 2A is a fragmented sectional view of a compound semiconductor substrate according to the present invention.

Referring to FIGS. 2A, 2B and 2C, a compound semiconductor substrate according to the present invention comprises a single-crystalline semiconductor wafer substrate 11, a first SLS structure layer 12, a compound semiconductor buffer layer 13, a second SLS structure layer 14, and a top compound semiconductor epitaxial layer 15.

The wafer substrate 11 has a lattice constant $a_s$ and is a compound semiconductor (e.g., GaAs) wafer or a silicon (Si) wafer. The top epitaxial layer 15 has a desired lattice constant $a_e$ (e.g., for a desired emission wavelength of a semiconductor laser) and is composed of a binary, ternary or quaternary III-V compound semiconductor, such as GaAs, InGaP (e.g., $In_{0.25}Ga_{0.75}P$, InP, InGaAsP and InGaAlP).

Figure 3A:
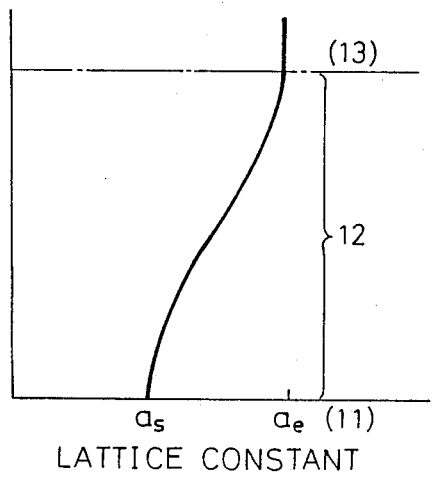
FIG. 3A is a graph of lattice constant variation of an SLS structure layer formed on a wafer substrate.
Figure 3B:
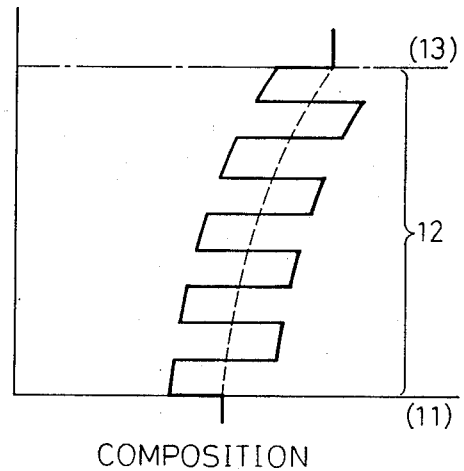
FIG. 3B is a graph of composition variation of the SLS structure layer of FIG. 3A.

The first SLS structure layer 12 has a lattice constant gradually varying from the "$a_s$" of the wafer substrate 11 to the "$a_e$" of the top epitaxial layer 15, as shown in FIGS. 2B and 3A.

Where the $In_{0.25}Ga_{0.75}P$ layer 15 is epitaxially grown above the GaAs wafer substrate 11, the SLS structure layer 12 consists of, e.g., $In_xGa_{1-x}P$-$In_yGa_{1-y}P$ with the composition ratios "x" and "y" varying from 0.63 to 0.38 and from 0.37 to 0.12, respectively, as shown in FIG. 2C and 3B. Each of the InGaP thin layers has a thickness of from 5 to 30 nm, preferably 20 nm. The periodic number of the $In_xGa_{1-x}P$-$In_yGA_{1-y}P$ SLS is from 10 to 50, preferably 30.

Figure 4A:
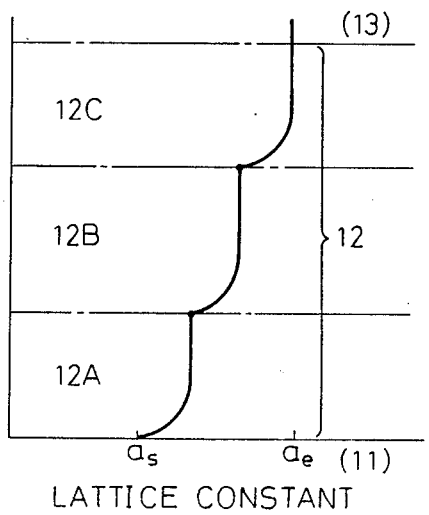
FIG. 4A is a graph of lattice constant variation of another type SLS structure layer formed on the wafer substrate.
Figure 4B:
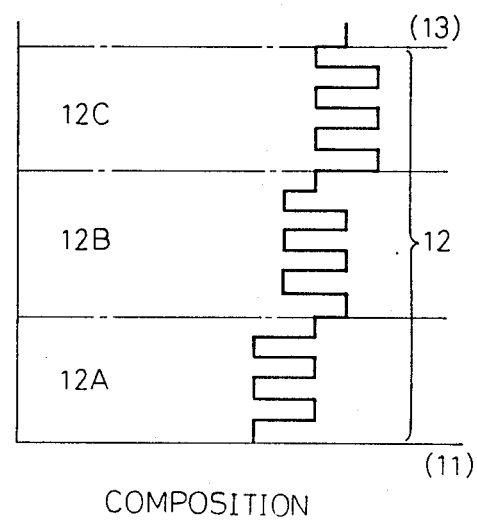
FIG. 4B is a graph of composition variation of the another type SLS structure layer of FIG. 4A.

As shown in FIGS. 4A and 4B, it is possible to form the first SLS structure layer 12, the lattice constant of which varies stepwise, of SLS layers 12A, 12B, ... having different lattice constants $a_{A1}$, $a_{A2}$, ... of, e.g.:

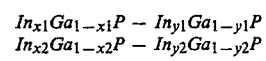

Where the $In_{0.25}Ga_{0.75}P$ layer 15 is epitaxially grown above the GaAs wafer substrate 11, the SLS structure layer 12 consists of:

a 15-period GaP (10 nm)-$Ga_{0.83}IN_{0.17}P$ (10 nm) SLS layer 12A;

a 15-period $Ga_{0.51}In_{0.09}P$ (10 nm)-$Ga_{0.75}In_{0.25}P$ SLS layer 12B; and a 15-period $Ga_{0.91}In_{0.09}P$ (10 nm)-$Ga_{0.67}In_{0.33}P$ SLS layer 12C.

The first SLS structure layer 12 changes its lattice constant and has the effects whereby strain caused by lattice constant variation is relieved and the upward propagation of dislocations is suppressed.

Figure 5:
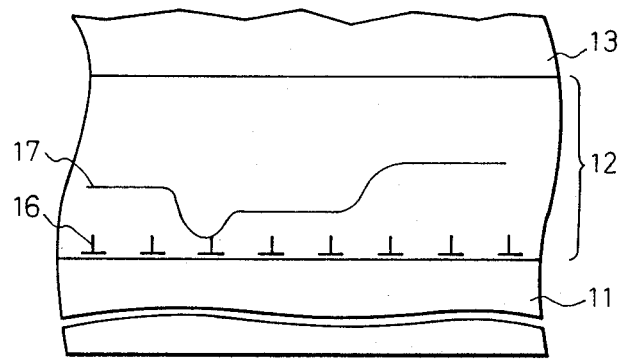
FIG. 5 is a partially enlarged sectional view of the substrate of FIG. 2A.

As shown in FIG. 5, the strain relief is attained by introducing small dislocations 16, and a threading dislocation 17 generated in the layer 12 is bent to prevent it from extending to the surface of the layer 12.

The compound semiconductor buffer layer 13 has a lattice constant equal to the "$a_e$" of the top epitaxial layer 15, is epitaxially grown on the SLS structure layer 13, and is composed of a binary, ternary or quaternary III-V compound semiconductor, such as GaAs, InGaP (e.g., $In_{0.25}GA_{0.75}P$), GaAsP (e.g., $GaAs_{0.5}P_{0.5}$), InP and InGaAsP. The buffer layer 13 has a thickness of 0.1 to 3 μm, preferably from 0.3 to 2 μm, and is sufficiently large for the total thickness of the SLS structure layers 12 and 14, since the buffer layer 13 fixes (stabilizes) the lattice constant ($a_e$) changed by the SLS structure layer 12, absorbs residual internal stress, and serves as a substrate having the lattice constant "$a_e$" for the second SLS structure layer 14. Where the $In_{0.25}Ga_{0.75}P$ layer 15 is epitaxially grown above the GaAs wafer substrate 11, preferably the $GaAs_{0.5}P_{0.5}$ buffer layer is 1 μm thick.

Figure 6A:
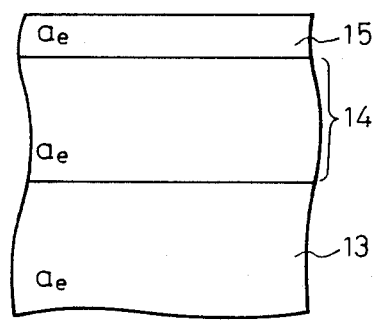
FIG. 6A is a partially enlarged sectional view of the substrate of FIG. 2A.
Figure 6B:
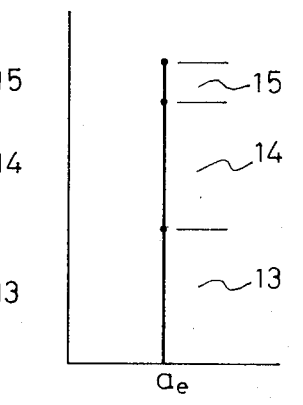
FIG. 6B is a graph of lattice constant of the layers of FIG. 6A.
Figure 6C:
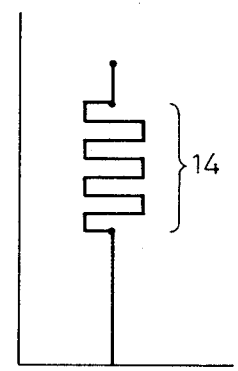
FIG. 6C is a graph of composition variation of the layers of FIG. 6A.

The second SLS structure layer 14 (FIGS. 2A and 6A) has a fixed lattice constant "$a_e$" equal to that of top epitaxial layer 15, as shown in FIGS. 2B and 6B. Where the $In_{0.25}Ga_{0.75}P$ layer 15 is epitaxially grown, the SLS structure layer 14 consists of, e.g., $In_xGa_{1-x}P$-$In_yGa_{1-y}P$ with the composition ratios "x" and "y" being 0.35 an 0.14, respectively, as shown in FIGS. 2C and 6C. Each of the InGaP thin layers has a thickness of 5 to 30 nm, preferably 15 nm, and the periodic number of the $In_xGA_{1-x}P$-$In_yGa_{1-y}P$ SLS is from 5 to 30, preferably 10.

When the strained lattice constant of a SLS is equal to that of the substrate (i.e., the fixed lattice constant of the SLS structure layer 14 is equal to that of the buffer layer 13), it is possible to prevent a generation of new dislocations and to effectively reduce (filter) the dislocation density, unless the thickness of each thin layer of SLS exceeds a certain critical thickness. Therefore, the SLS structure layer 14 prevents an extension of threading dislocations to the surface of the layer 14.

The layers 12 to 15 are formed by a conventional metalorganic chemical vapor deposition (MOCVD) process or molecular beam epitaxy (MBE) process.

A GaAs/Si substrate with SLS can be composed of a Si single-crystalline silicon wafer 11; a first SLS structure layer 12 of a 40 period $GaAs_{1-x}P_x$ (20 nm)-$GaAs_{1-y}P_y$ (20 nm) with the composition ratios "x" and "y" varying from 0 to 0.8 and from 0.2 to 1, respectively; a GaAs buffer layer 13 about 1 μm thick; a second SLS structure layer 14 of a 15 period $GaAs_{0.8}P_{0.2}$ (15 nm)-GaAs (15 nm); and a GaAs epitaxial layer 15. In this case, it is possible to adopt $In_xGa_{1-x}As$-$GaAs_{1-y}P_y$ SLS for the SLS structure layer 14.

According to the present invention, the combination of the first SLS structure layer for compensating a lattice mismatch and a relating thick compound semiconductor buffer layer and the second SLS structure layer for filtering dislocations, attains the top compound semiconductor epitaxial layer having a lattice constant different from that of the wafer substrate and an extremely low density of crystal defects, i.e., low dislocation density. Since it is possible to design the changing of lattice constant and inhibition of dislocation propagation individually, the fir and second SLS structures can be optimized for t purposes, respectively.

It will be obvious that the present is not restricted to the above-mentioned and that many variations are possible for persons in the art without departing from the scope of invention.

I claim:

1. A semiconductor substrate including a top epitaxial semiconductor layer comprising:

a single-crystalline semiconductor wafer substrate;

a strained layer superlattice structure layer having a lattice constant varying from that of said wafer substrate to that of said top semiconductor layer and formed on said wafer substrate;

a compound semiconductor buffer layer having the same lattice constant as that of said top semiconductor layer and formed on said strained layer superlattice structure layer;

another strained layer superlattice structure layer for filtering dislocations having a fixed lattice constant equal to that of said top semiconductor layer and formed on said buffer layer; and the top semiconductor layer formed on said another strained layer superlattice structure layer.

2. A semiconductor substrate according to claim 1, wherein said wafer substrate is composed of a compound semiconductor.

3. A semiconductor substrate according to claim 2, wherein said compound semiconductor is GaAs.

4. A semiconductor substrate according to claim 1, wherein said wafer substrate is composed of silicon.

5. A semiconductor substrate according to claim 4, wherein said top semiconductor layer is composed of GaAs.

6. A semiconductor substrate according to claim 1, wherein the lattice constant of said strained layer superlattice structure layer varies continuously.

7. A semiconductor substrate according to claim 1, wherein the lattice constant of said strained layer superlattice structure layer varies stepwise.

8. A semiconductor substrate according to claim 1, wherein each of layers of said strained layer superlattice structure layer has a thickness of from 5 to 30 μm.

9. A semiconductor substrate according to claim 1, wherein said buffer layer has a thickness of from 0.1 to 3 μm.

* * * * *